US009824754B2

(12) United States Patent
Mandava et al.

(10) Patent No.: US 9,824,754 B2
(45) Date of Patent: *Nov. 21, 2017

(54) TECHNIQUES FOR DETERMINING VICTIM ROW ADDRESSES IN A VOLATILE MEMORY

(71) Applicant: INTEL CORPORATION, Santa Clara, CA (US)

(72) Inventors: Sreenivas Mandava, Los Altos, CA (US); Brian S. Morris, Santa Clara, CA (US); Suneeta Sah, Portland, OR (US); Roy M. Stevens, Lexington, SC (US); Ted Rossin, Fort Collins, CO (US); Mathew W. Stefaniw, Santa Clara, CA (US); John H. Crawford, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 2 days.

This patent is subject to a terminal disclaimer.

(21) Appl. No.: 15/000,643

(22) Filed: Jan. 19, 2016

(65) Prior Publication Data
US 2016/0224262 A1 Aug. 4, 2016

Related U.S. Application Data

(63) Continuation of application No. 14/133,011, filed on Dec. 18, 2013, now Pat. No. 9,269,436.

(51) Int. Cl.
*G11C 7/02* (2006.01)
*G11C 11/406* (2006.01)
(Continued)

(52) U.S. Cl.
CPC .......... *G11C 14/0009* (2013.01); *G06F 12/10* (2013.01); *G11C 7/02* (2013.01); *G11C 11/406* (2013.01); *G06F 2212/1032* (2013.01)

(58) Field of Classification Search
CPC .................. G06F 13/1636; G11C 7/02; G11C 11/406–11/40626
See application file for complete search history.

(56) References Cited

U.S. PATENT DOCUMENTS 9,269,436 B2 * 2/2016 Mandava .............. G06F 3/0619
2007/0255889 A1 11/2007 Yogev et al.
(Continued)

FOREIGN PATENT DOCUMENTS

KR 10-2014-0106227 A 9/2014
WO 2014/178839 A1 11/2014
(Continued)

OTHER PUBLICATIONS

Colin Howell, "DDR3 SDRAM" Oct. 2010, retrieved from http://en.wikipedia.org/w/index.php?title=DDR3_SDRAM&oldid=392169497.
(Continued)

*Primary Examiner* — Nathan Sadler
(74) *Attorney, Agent, or Firm* — Compass IP Law PC (57) ABSTRACT

Examples are disclosed for determining a logical address of one or more victim rows of a volatile memory based on a logical address of an aggressor row and address translation schemes associated with the volatile memory. Other examples are described and claimed.

31 Claims, 7 Drawing Sheets

(51) Int. Cl.
*G06F 12/10* (2016.01)
*G11C 14/00* (2006.01)

(56) References Cited

U.S. PATENT DOCUMENTS

| | | |
|---|---|---|
| 2010/0091586 A1 | 4/2010 | Carman |
| 2010/0128788 A1 | 5/2010 | Moccagatta et al. |
| 2013/0194690 A1 | 8/2013 | Inoue |
| 2013/0268727 A1 | 10/2013 | Sohn et al. |
| 2013/0304982 A1 | 11/2013 | Jung et al. |
| 2014/0006703 A1* | 1/2014 | Bains ............... G11C 11/40618 711/106 |
| 2014/0089576 A1 | 3/2014 | Bains et al. |
| 2014/0146624 A1 | 5/2014 | Son et al. |
| 2014/0219043 A1 | 8/2014 | Jones et al. |
| 2014/0241099 A1 | 8/2014 | Seo et al. |
| 2014/0281206 A1 | 9/2014 | Crawford et al. |
| 2014/0281207 A1 | 9/2014 | Mandava et al. |
| 2014/0334225 A1 | 11/2014 | Cordero et al. |
| 2015/0003180 A1 | 1/2015 | Kim |
| 2015/0016204 A1 | 1/2015 | Dong et al. |
| 2015/0055420 A1 | 2/2015 | Bell et al. |
| 2015/0058549 A1 | 2/2015 | Jeffrey et al. |
| 2015/0063049 A1 | 3/2015 | Yang |
| 2015/0100723 A1 | 4/2015 | Brandl |
| 2015/0120999 A1 | 4/2015 | Kim et al. |
| 2016/0078911 A1* | 3/2016 | Fujiwara ............... G11C 29/022 365/189.2 |
| 2016/0202926 A1* | 7/2016 | Benedict ............... G11C 11/408 711/106 |

FOREIGN PATENT DOCUMENTS

| | | |
|---|---|---|
| WO | 2015/030751 A1 | 3/2015 |
| WO | 2015/047304 A1 | 4/2015 |

OTHER PUBLICATIONS

Chao, et al. "Fault Models for Embeded-Dram Macros" Jul. 2009, ACM, DAC'09.

Mike Micheletti "Turning DDR4 for Power and Performance", Aug. 2013, retrieved from http://www.memcon.com/pdfs/proceedings2013/track1/Tuning_DDR4_for_Power_and_Performance.pdf.

Kim, et al. "Architectural Support for Mitigating Row Hammering in DRAM Memories." May 2014, IEEE Computer Architecture Letters.

Kim, et al. "Flipping Bits in Memory Without Accessing Them: An experimental Study of DRAM Disturbance Errors", Jun. 2014, IEEE, ISCA '14, pp. 361-372.

\* cited by examiner

```
RECEIVE, AT CIRCUITRY FOR A MEMORY CONTROLLER, A FIRST
LOGICAL ADDRESS FOR AN AGGRESSOR ROW FOR DRAM, THE
AGGRESSOR ROW ASSOCIATED WITH AN ACTIVATION THAT
TRIGGERS A pTRR TO ONE OR MORE VICTIM ROWS TO PROTECT
AGAINST A ROW HAMMER ERROR
602
```

```
RECEIVE AN INDICATION OF AT LEAST ONE ADDRESS TRANSLATION
SCHEME FROM ONE OR MORE CONTROL REGISTERS ACCESSIBLE
TO THE MEMORY CONTROLLER
604
```

```
DETERMINE A FIRST PHYSICAL ADDRESS FOR THE AGGRESSOR
ROW BASED ON ADDRESS TRANSLATION SCHEME INDICATED IN
THE ONE OR MORE CONTROL REGISTERS
606
```

```
INCREMENT OR DECREMENT THE FIRST PHYSICAL ADDRESS TO
DETERMINE ONE OR MORE RESPECTIVE PHYSICAL ADDRESSES
FOR THE ONE OR MORE VICTIM ROWS
608
```

```
DETERMINE ONE OR MORE RESPECTIVE LOGICAL ADDRESSES FOR
THE ONE OR MORE VICTIM ROWS BASED ON IMPLEMENTING THE
ADDRESS TRANSLATION SCHEME ON THE ONE OR MORE
RESPECTIVE PHYSICAL ADDRESSES
610
```

```
SELECT THE ONE OR MORE RESPECTIVE LOGICAL ADDRESSES FOR
THE pTRR
612
```

TECHNIQUES FOR DETERMINING VICTIM ROW ADDRESSES IN A VOLATILE MEMORY

RELATED CASE

This application is a continuation of, claims the benefit of and priority to previously filed U.S. patent application Ser. No. 14/133,011 filed Dec. 18, 2013, which claims priority to U.S. Provisional Patent Application No. 61/777,089, filed on Mar. 12, 2013, both of which are hereby incorporated by reference in their entirety.

TECHNICAL FIELD

Examples described herein are generally related to memory access to dynamic random access memory.

BACKGROUND

As dynamic random access memory (DRAM) technologies are scaled to smaller dimensions, reliability issues arise that require mitigation by careful design. One such issue is the noise or disturbance injected into neighboring cells when a row is activated and refreshed repeatedly. The voltage swings and current driven when a row (called the aggressor) is activated or refreshed can inject noise into neighboring cells (victims), potentially draining a little bit of charge from the victim's storage capacitors. The more often the aggressor row is activated before its victim neighbors are activated or refreshed, and the weaker the victim cells (smaller charge, higher leakage, etc.), the higher the probability that one or more cells in the victim row will flip and thus may cause data corruption. The multiple activates to an aggressor row is typically referred to as row hammer.

DETAILED DESCRIPTION

As contemplated in the present disclosure, as DRAM may scale to greater densities having smaller transistor gate widths, a high number of activates to a single row of a DRAM within a refresh window may increase a potential for corruption of data in adjacent or victim rows. These multiple activates, as mentioned previously, may be referred to as a row hammer.

A TRR (target row refresh) command may be added to future DRAMs so that a memory controller may be capable of providing the aggressor address to the DRAMs to allow the DRAMs to compute the victim addresses for that aggressor internally, freeing the memory controller from having to do this calculation. However, current uses of DRAMs such as in dual in-line memory modules (DIMMs) lack this capability to compute victim addresses.

In some examples, a pseudo TRR (pTRR) may be selected for victim rows to refresh these rows with less of a performance penalty than a TRR command. But, as mentioned above, DRAMs currently lack an ability to determine or calculate victim addresses for victim rows possibly subject to row hammer errors. Also, various addressing schemes may be utilized by vendors for DIMMs including DRAM that may require some logical-to-physical address translations to first determine the physical address of the aggressor row and from that physical address determine the physical addresses of one or more victim rows. Second, the physical addresses of the one or more victim rows must be translated back to logical addresses so that a memory controller can schedule a pTRR for the one or more victim rows. It is with respect to these and other challenges that the examples described herein are needed.

In some examples, a first logical address for an aggressor row for a volatile memory (e.g., DRAM) may be received at circuitry for a memory controller. For these examples, the aggressor row may be associated with an activation that triggers a pTRR to one or more victim rows to protect against a row hammer error. A first physical address for the aggressor row may then be determined based on an address translation scheme associated with the volatile memory. The first physical address may then be incremented or decremented to determine one or more respective physical addresses for the one or more victim rows. One or more respective logical addresses for the one or more victim rows may then be determined based on implementing the address translation scheme on the one or more respective physical addresses. The one or more respective logical address may then be selected for the pTRR.

Figure 1:
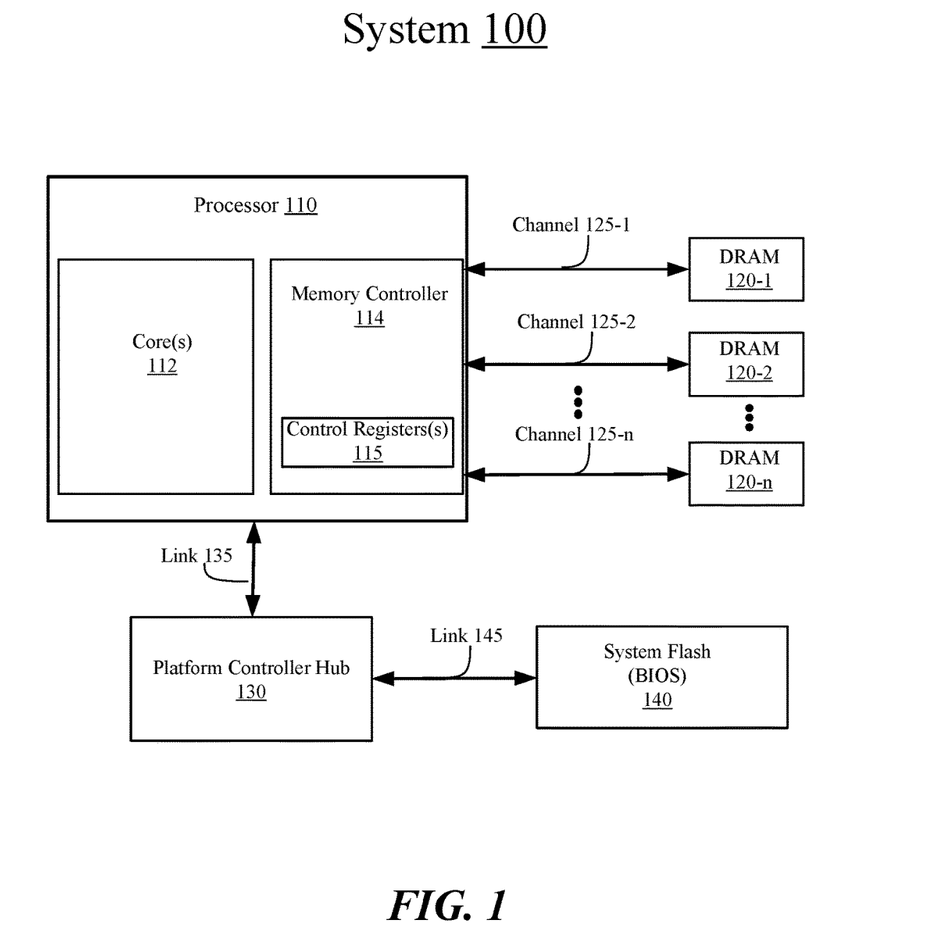
FIG. 1 illustrates an example first system.

FIG. 1 illustrates an example first system. As shown in FIG. 1, the first system includes system 100. In some examples, system 100 may include a processor 110, a platform controller hub 130, a system flash 140 or DRAMs 120-1 to 120-n, where "n" is any positive whole integer greater than 2. Also, as shown in FIG. 1, DRAMs 120-1 to 120-n may couple to processor 110 via respective channels 125-1 to 125-n.

According to some examples, as shown in FIG. 1, processor 110 may include core(s) 112 and a memory controller 114. For these examples, memory controller 114 may include logic and/or features to serve as an integrated memory controller for processor 110. As the integrated memory controller for processor 110, memory controller 114 may facilitate read or write access to DRAMs 120-1 to 120-n for elements of processor 110 such as core(s) 112. In some examples, the logic and/or features of memory controller 114 may interrogate or access control register(s) 115 to determine if and/or what address translation schemes may be associated with DRAMs 120-1 to 120-n. As described in more detail below, the logic and/or features of memory controller 114 may perform address translations on a logical address for aggressor rows to determine logical addresses for victim rows.

In some examples, system flash 140 may be capable of storing a basic input output system (BIOS). For these examples, during system boot of system 100, the BIOS may be forwarded via communication link 145 to platform controller hub 130 and then to core(s) 112 via link 135. The BIOS may include software instructions to be executed by core(s) 112 as at least a part of the system boot.

According to some examples, DRAMs 120-1 to 120-n may or may not be on separate dual in-line memory modules (DIMMs) each having a plurality of DRAM chips. The DIMMs may include various types of DRAM such as double data rate synchronous DRAM (DDR SDRAM) as described in one or more technical standards or specifications to include those published by the JEDEC Solid State Technology Association ("JEDEC") for various generations of DDR such as DDR2, DDR3, DDR4 or future DDR generations. For example, JESD79-3F—"DDR3 SDRAM Standard", published in July 2012 and/or later revisions. The DIMMs may be arranged in various configurations to include, but are not limited to, register DIMMs (RDIMMs), load reduced DIMMs (LRDIMMS), unregistered DIMMs (UDIMMs) or fully buffered DIMMs (FB-DIMMs). These various configurations may also be described in one or more technical standards published by JEDEC.

In some examples, DRAMs 120-1 to 120-n may separately or jointly include operating parameter information in a serial presence detect (SPD) table maintained at or with DRAMs 120-1 to 120-n (not shown). The SPD table may include information to indicate possible address translation schemes used by DRAMs 120-1 to 120-n. These possible address translation schemes may include, but are not limited to, a direct logical-to-physical, mirroring, vendor specific (e.g., swizzling), or bit inversion. In some examples, logic and/or features at memory controller 114 may have access to the SPD table. As described in more detail below, the logic and/or features may be capable of performing address translations on a logical address for an aggressor row associated with an activation that triggers a pTRR to determine logical addresses for victim rows using one or more of these possible address translation schemes. The logic and/or features may then select the logical addresses for the victim rows for the pTRR.

According to some examples, every time memory controller 114 issues a transaction, there is a probability '1-in-P', where "P" equates to the probabilistic row hammer detection value, that memory control 114 may clean up victim rows physically adjacent to the aggressor row of the original transaction. For these examples, P may be determined such that a likelihood of not cleaning the victim rows before reaching a given row hammer limit for DRAMs 120-1 to 120-n may be very small. In some examples, for row hammer limits around 250,000, the P may be set low enough to have a very small impact on performance and power usage by DRAMs 120-1 to 120-n. In other words, pTRRs to victim rows may be sent at a rate based on P that may have a relatively small impact on performance and power usage as compared to just shortening a scheduled row refresh period to reduce risks of reaching the row hammer limit.

Figure 2:
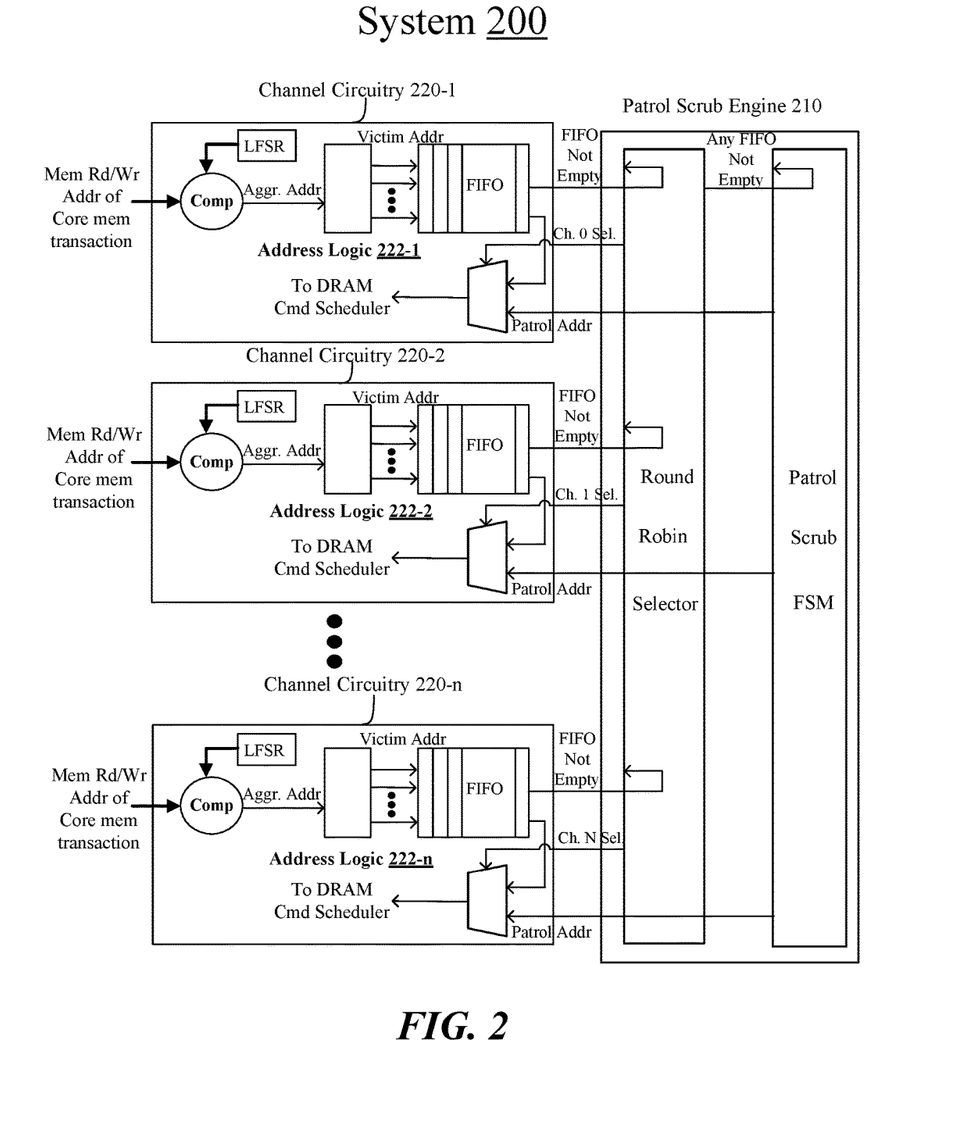
FIG. 2 illustrate an example second system.

FIG. 2 illustrates an example second system. As shown in FIG. 2, the second system may include system 200. In some examples, as shown in FIG. 2, system 200 includes a patrol scrub engine 210 coupled to channel circuitry 220-1 to 220-n. According to some examples, system 200 may be part of an integrated memory controller controlling DIMMs having DRAM similar to memory controller 114 receiving memory read/write addresses of core memory transaction to one or more cores similar to core(s) 112 of processor 110 for a computing system having a BIOS.

In some examples, patrol engine 210 and channel circuitry 220-1 to 220-n may be implemented to issue patrol scrubs (to correct possible errors in memory) at an increased rate to account for injecting a pTRR to one or more victim rows associated with aggressor rows in one or more DIMMs. The increased rate may be in addition to satisfying possible requirements to send a patrol scrub to every memory address associated with DRAM included in the one or more DIMMs every 24 hours.

According to some examples, as shown in FIG. 2, channel circuitry 220-1 to 220-n may each have a linear feedback shift register (LFSR) to generate a pseudo random number. For these examples, logic and/or features located at or with channel circuitry 220-1, 220-2, 220-n or patrol scrub engine 210 may be capable of causing respective LFSRs to generate a random number following a first activation to an aggressor row of DRAM included in the one or more DIMMs. For these examples, the logic and/or features may compare the generated random number to an expected random number (e.g., using an evaluation table) and based on the comparison, a pTRR may be sent to victim rows associated with the aggressor row. Address logic 222-1 to 222-n for channel circuitry 220-1 to 220-n may be capable of determining a logical address for the one or more victim rows associated with the aggressor row based on one or more address translation schemes associated with the DRAM.

According to some examples, address logic 222-1 to 222-n may be capable of selecting respective logical addresses for the one or more victim rows for the pTRR. For these examples, selecting may include address logic 222-1 to 222-n causing the one or more respective logical addresses to be stored in a first-in, first-out (FIFO) memory. Patrol engine 210 may include logic and/or features to use the FIFO to selectively cause the one or more respective logical addresses to be sent to a DRAM command scheduler to cause the memory controller to send the pTRR to one or more victim rows having the one or more respective logical addresses.

In some examples, when channel circuitry 220-1 to 220-n has determined a pTRR to victim rows of a suspected aggressor is needed, the row addresses of the victim rows need to be determined. In an ideal case, logical addresses of the victim rows are adjacent to the logical address of the aggressor row, for example, the aggressor row logical address +1 and the aggressor row logical address −1. However, the row address of the aggressor from the perspective of the memory controller is a logical address, and a logical-to-physical address translation is needed, then an increment/decrement of the physical the row address, and then perform a reverse (physical-to-logical) address translation in order to determine the logical addresses for the victim rows. These logical addresses for the victim rows are then sent by the memory controller.

According to some examples, four sources or needs for logical-to-physical and physical-to-logical address translation may lead to four different address translation schemes: (1) inversion of row address bits ("bit inversion") driven by a register in a memory controlled used with RDIMMs or LRDIMMs that may affect some (typically half) of the devices of some ranks in these DIMMs; (2) mirroring for LRDIMMs and Dual Rank UDIMMs; (3) re-mapping of addresses internal to a DRAM device (e.g., "swizzling" or "vendor specific"); and (4) redundant row remapping inside a DRAM device.

In some examples, mirroring and swizzling address translation schemes may affect an entire rank for a given DIMM associated with these address translation schemes. Bit inversion typically affects half of a rank (that is, half of the DRAM devices in a DIMM receive the inverted address bits, and the other half of the DRAM devices in the DIMM receives the original non-inverted address bits).

According to some examples, in order to generate the correct addresses for the victim rows, mirroring, swizzling and bit inversion address translation schemes need to be accounted for. As mentioned above, mirroring and swizzling may affect the entire rank, thus, victim addresses in these ranks may both be affected by these address translation schemes, but only two victim addresses need to be generated. However, because bit inversion affects only some (typically half) of the DRAM devices in the rank, and the activate/refresh cycles are driven to all of the DRAM devices in a rank at once, if bit inversion is used in a rank, the address logic 222-1 to 222-n needs to generate four victim addresses: +/−1 with bit inversion, +/−1 without bit inversion.

In some examples, if row address bit 0 (referenced as $A_0$ below) does not participate in any of the {inversion, mirroring, swizzling} address translation schemes, then at most three victim addresses may need to be generated because one or two of the four potential victim addresses will be redundant (as shown below).

According to some examples, bit inversion is enabled on a per-rank basis by setting the bits of a register field in the memory controller (e.g., control register(s) 115) corresponding to the ranks with inversion. For example, DDR3 RDIMMs based on the JESD79-3F standard may invert most of the row address bits driven by an on-DIMM register to half of the DRAMs in a rank in order to improve signal integrity and power delivery. Bit inversion is typically performed by performing an Exclusive OR (XOR) operation on the bits in the RowAddress with EBF8 (hexadecimal) (RowAddress XOR 0xEBF8).

In some examples, bit inversion may not lead to unique pTRRs. The processor having the memory controller may suppress these redundant pTRRs by providing a register bit in the register in the memory controller to control injecting an inverted victim address only when the Row A[2:0] of the aggressor is 000 or 111, as the other row address bit combinations may not generate a carry or borrow out of the low three bits. These low three bits typically don't participate in bit inversion. This type of bit inversion control may be used in cases where there is no swizzling or vendor specific address translation.

According to some examples, even when extra pTRRs may be needed for bit inversion (when Row A[2:0] is 000 or 111), at most 3 unique row addresses may be needed in the case where there may be no swizzling internal to the DRAM, and row address bit 0 does not participate in the bit inversion (this is typically the case). The extra pTRR required may be determined by the low-order address bit (bit 0) of the aggressor address, $A_0$. If $A_0$ is 0, then the +1 inverted pTRR may be the same as the non-inverted one, and can be elided or left out of consideration. This may be due to an ability to add 1 to a row address that has its low-order bit 0 without causing a carry into the upper bits which participate in bit inversion. Similarly, if $A_0$ is 1, then the −1 inverted pTRR will be the same as the non-inverted one, and can be elided, since it may be possible to subtract one from such a row address without causing a borrow into the bits affected by bit inversion.

In some examples, mirroring is enabled on a per-rank basis by setting the mirror enable bits of the register field corresponding to the ranks with mirroring (e.g., via control register(s) 115). Types of DIMMs such as UDIMMs or LRDIMMs may use mirroring address translation schemes on the DIMM to reduce cost. Mirroring may result in swapping address bits pairwise on one side of the DIMM. The addresses are typically paired as: A3:A4, A5:A6, A7:A8, and bank address bits BA0:BA1 as shown in Table I below.

TABLE I

| Connector Pin | SDRAM Pin | |
|---|---|---|
| | Rank 0 | Rank 1 |
| A3 | A3 | A4 |
| A4 | A4 | A3 |
| A5 | A5 | A6 |
| A6 | A6 | A5 |
| A7 | A7 | A8 |
| A8 | A8 | A7 |
| BA0 | BA0 | BA1 |
| BA1 | BA1 | BA0 |

According to some examples, swizzling or a vendor specific address scheme may include swizzling of addresses for DRAM devices of some DRAM vendors that may be controlled on a per-DIMM basis via a control register bit(s) in the register in the memory controller (e.g., control register(s) 115). The swizzling or vendor specific address scheme should be enabled only for specific vendors who use a given internal row swizzling. The memory controller may need swizzling logic for each unique vendor specified swizzle, and a way to select the proper swizzling for each rank (or DIMM) in a given system. In some examples, an SPD located at or with a DIMM may identify the vendor of the DIMM, so if the DIMMs from a given vendor always apply a vendor-specific swizzling, the vendor identification may indicate the presence of swizzling, and can be set by the BIOS during system initialization. In another embodiment, a separate field in the SPD could indicate a particular swizzling. In other examples, a register in a DRAM could be interrogated to identify the presence and type of swizzling or vendor specific address translation scheme used.

In some examples, to add to the above description of bit inversion address translation schemes, for a DIMM rank that uses row address-bit inversion for some (typically half) of the DRAMs in that rank, if row address bit 0 ($A_0$) does not participate in the swizzling (or bit inversion or mirroring), then at most three addresses may need to be generated in the pTRR sequence to refresh the potential victim rows, with the third one required to be only one of the two inverted variants, as determined by $A_0$. If $A_0$ is 0, then the +1 variant can be elided; if $A_0$ is 1, then the −1 variant can be elided, since in these cases only $A_0$ is affected by the +−1 computation, and by definition it does not affect any of the address transformations. Note that in case $A_1$ or $A_2$ participate in the swizzling, then the test identified above (low-order row address is 000 or 111) does not apply, and only the $A_0$ test may be useful for eliding the redundant extra activates/refreshes for ranks with bit inversion.

According to some examples, for DIMMs that use more than one of {swizzling, inversion, mirroring} address translation schemes, the order in which the transformations are performed may be important. For example, the address translation order from an identified aggressor logical address to a victim logical address may be Bit Inversion, Mirroring, Swizzling/Vendor Specific, Increment/Decrement, UnSwizzling, UnMirroring, UnInversion.

In some examples, a bit inversion address translation may be performed on the aggressor row address by inverting the following row address bits A[15], A[14], A[13], A[11], A[9], A[8], A[7], A[6], A[5], A[4], A[3] in the aggressor row address. The operation can be accomplished by performing an XOR operation of the aggressor row address and mask hexadecimal EBF8 (Aggressor Row Address XOR 0xEBF8).

According to some examples, a mirroring address translation scheme may performed on the aggressor row address by performing a mirror address translation on an aggressor row address by flipping the following row address bits in (A4:A3), (A6:A5), (A8:A7) in the aggressor row address, computing an address of a first victim row adjacent to an aggressor row of a volatile memory by incrementing the result of the mirror operation; and computing an address of a second victim row adjacent to an aggressor row of the volatile memory by decrementing the result of the mirror operation.

In some examples, a swizzling or vendor specific address translation scheme may be performed on the aggressor row address by performing a remapping address translation on the aggressor row address using a vendor specific address remapping scheme; computing an address of a first victim row adjacent to an aggressor row of a volatile memory by incrementing the result of the remapping operation; and computing an address of a second victim row adjacent to an aggressor row of the volatile memory by decrementing the result of the remapping operation.

Figure 3:
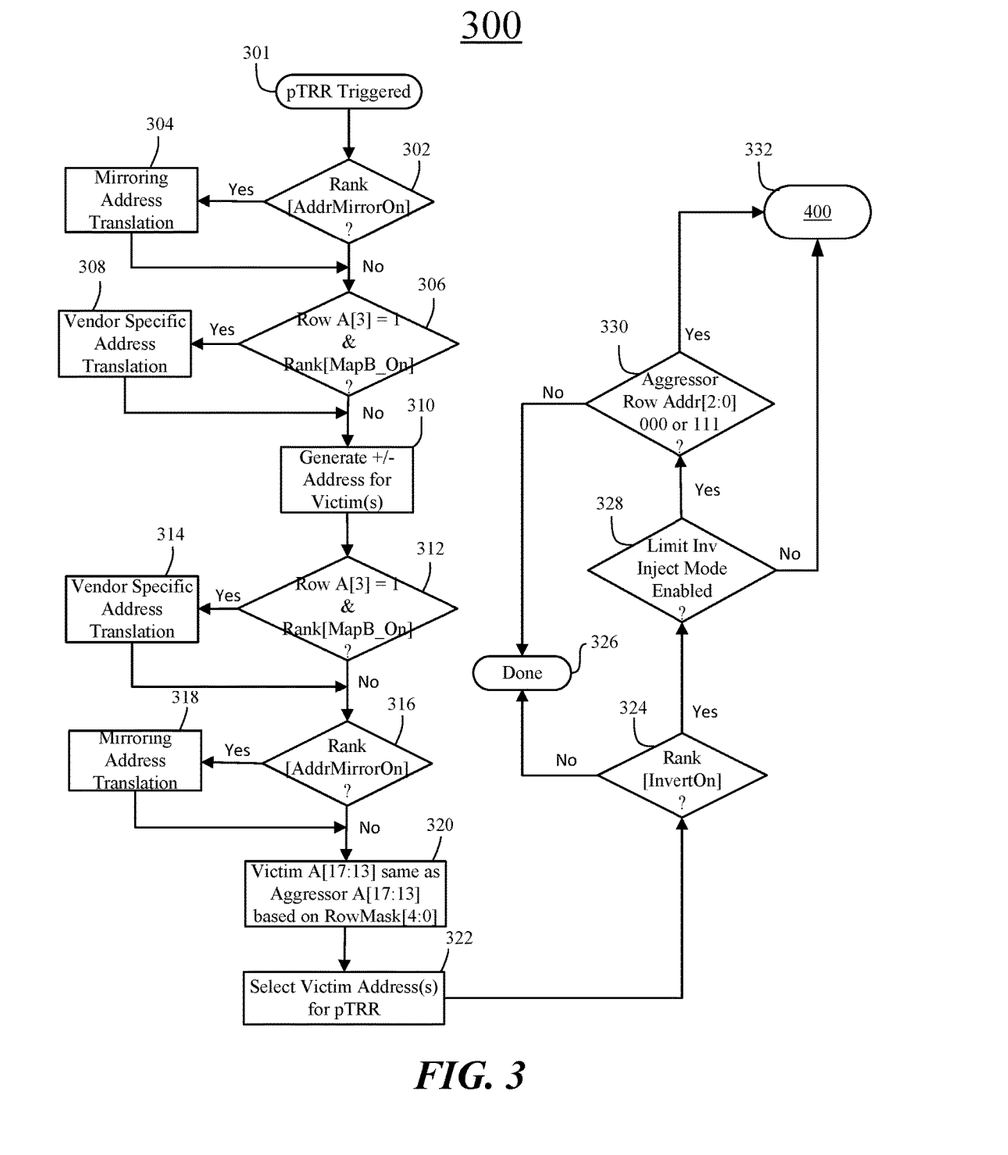
FIG. 3 illustrates an example first logic flow.

FIG. 3 illustrates an example first logic flow 300. In some examples, logic flow 300 may a first part of a two part logic flow for determining a logical address of one or more victim rows of a DRAM based on a logical address of an aggressor row and address translation schemes associated with the DRAM. For these examples, logic flow 300 may be implemented by elements of system 100 or system 200 as described above for FIGS. 1 and 2. However, the example processes or operations are not limited to implementation using elements of system 100 or 200.

At block 301, a pTRR may be triggered. In some examples, a logical address such as Aggressor Row Address A[17:0] may be used to inject a pTRR. Processing continues with decision block 302.

At decision block 302, if mirroring address translation is enabled for a rank for which the DRAM belongs (for example, Rank [AddrMirrorOn] is '1'), processing continues with block 304. If not, processing continues with decision block 306.

At block 304, a mirror address translation is performed on Aggressor Row Address[17:0]. In some examples, the Mirror address translation flips the following row address bits: (A4:A3), (A6:A5), (A8:A7) in the Aggressor Row Address A[17:0]. Processing continues with decision block 306.

At decision block 306, if bit 3 in Aggressor Row Address A[17:0] is 1 and DIMM vendor-specific row swizzling is required, processing continues with block 308. If not, processing continues with decision block 310.

At block 308, the Aggressor Row Address is swizzled as specified by the DIMM vendor specific address translation, processing continues with block 310.

At block 310, one or more physical addresses for the aggressor row above and below (+/−1 addresses) may be generated for one or more victim rows. A single victim row may exist when the aggressor row has a physical address that is at the beginning or end of physical rows. In other words, the aggressor row only has a single adjacent victim row. Processing continues with decision block 312 to perform physical-to-logical address translations of physical addresses for the one or more victim rows.

At decision block 312, if bit A[3] of a Victim Row Address [17;0] (Row A[3]==1) is '1' and vendor specific swizzling is required, processing continues with block 314. If not, processing continues with decision block 316.

At block 314, the Victim Row Addresses may then be swizzled using the vendor specific address translation, processing continues with decision block 316.

At decision block 316, if mirroring address translation is enabled (for example, Rank[AddMirrorOn]), processing continues with block 318. If not, processing continues with block 320.

At block 318, mirroring address translation may be performed on the victim addresses. Processing continues with block 320.

At block 320, the Victim Row Address [17:13] bits are not updated and retain the same value as the Aggressor Row Address [17:3] respectively based on per address bit Control Status Register (CSR). In some examples, this may prevent changing row bits for an unused row or LRDIMM Rank select bits. Processing continues with block 322.

At block 322, the logical addresses for the one or more victim rows may be selected for the pTRR. In some examples, this may include at least temporarily storing these one or more logical addresses in a queue or FIFO. Processing continues with decision block 324.

At decision block 324, if bit inversion address translation is enabled for the rank under consideration (for example, Rank[InvertOn] is '1'), processing continues with decision block 328. If not, processing continues with block 326.

At block 326, processing is complete.

At decision block 328, if Limit Inv Inject mode enabled, processing continues with decision block 330. Limit Inv Inject mode may limit a number of pTRRs created when bit inversion address translation is enabled. In this mode, pTRRs using the inverted address are injected only if aggressor's row address bits A[2:0] is either 000 or 111. If not, processing continues with block 332.

At block 330, if Aggressor Row Address[2:0] is 000 or 111, processing continues with block 332. If not, processing continues with decision block 326.

Figure 4:
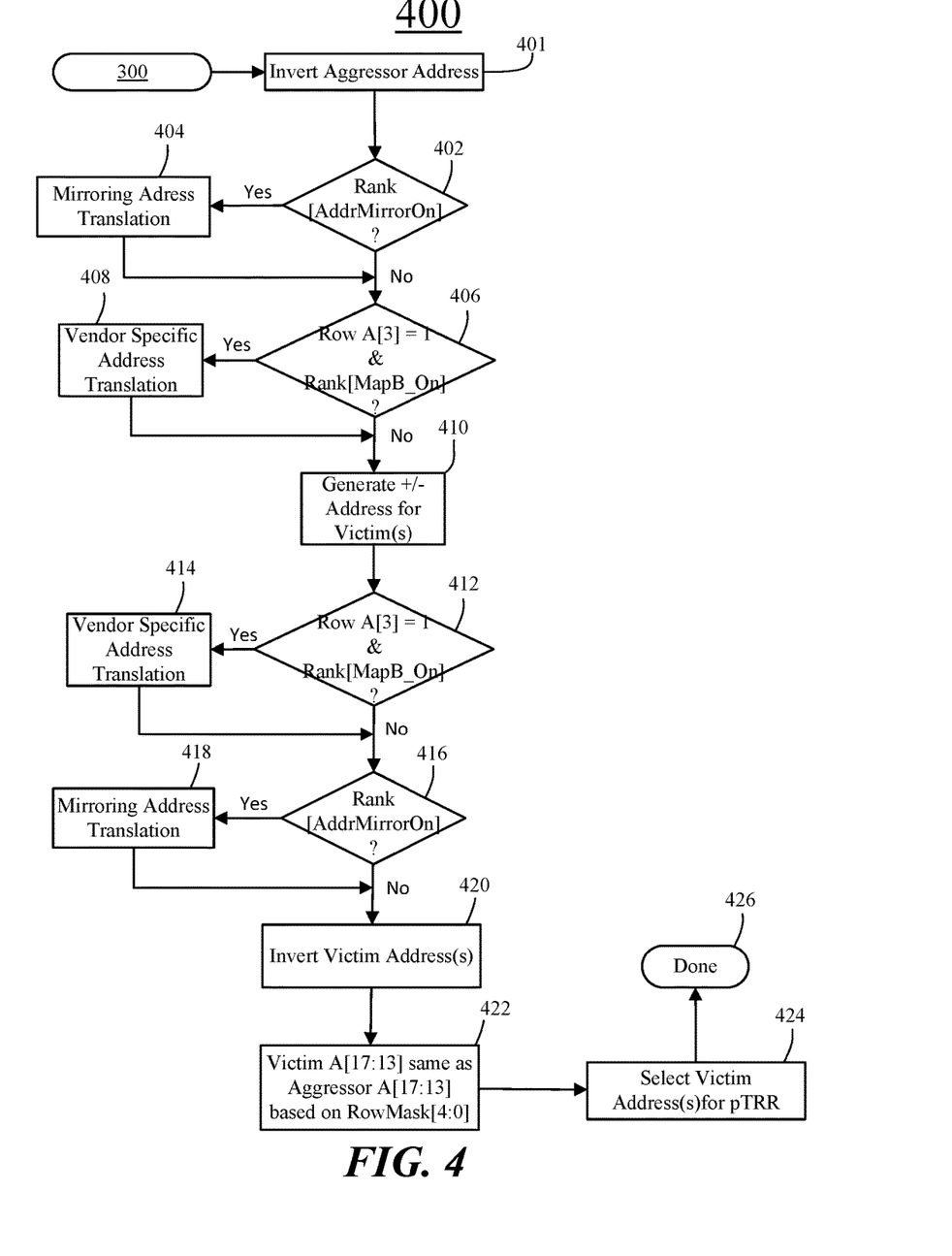
FIG. 4 illustrates an example second logic flow.

At block 332, processing moves to logic flow 400.

FIG. 4 illustrates an example second logic flow 400. In some examples, logic flow 400 may a second part of a two part logic flow for determining a logical address of one or more victim rows of a DRAM based on a logical address of an aggressor row and address translation schemes associated with the DRAM. For these examples, logic flow 400 may also be implemented by elements of system 100 or system 200 as described above for FIGS. 1 and 2. However, the example processes or operations are not limited to implementation using elements of system 100 or 200.

At block 401, the aggressor logical address is inverted. Bit inversion address translation may be performed as (Row Address XOR 0xebf8). Processing continues with decision block 402.

At decision block 402, if mirroring address translation is enabled, processing continues with block 404. If not, processing continues with decision block 406.

At block 404, mirroring address translation is performed on the logical address for the aggressor row. Processing continues with decision block 406.

At decision block 406, if bit 3 in Aggressor Row Address A[17:0] is 1 and DIMM vendor-specific row swizzling is required ((A[3]==1) and Rank[MapB_On]), processing continues with block 408. If not, processing continues with block 410.

At block 408, the Aggressor Row Address may be swizzled using the vendor specific address translation as specified by the DIMM vendor, processing continues with block 410.

At block 410, one or more physical address for the aggressor row above and below (+/−1 addresses) may be generated for one or more victim rows. Processing continues with decision block 412.

At decision block 412, if bit A[3] of the Victim Row Address [17;0] (Row A[3]==1) is '1' and vendor specific swizzling is required ((A[3]==1) and Rank[MapB_On]), processing continues with block 414. If not, processing continues with decision block 416.

At block 414, the Victim Row Address is swizzled using the vendor specific address translation, processing continues with decision block 416.

At decision block 416, if mirroring address translation is enabled (for example, Rank[AddMirrorOn]), processing continues with block 418.

At block 418, mirroring address translation may be performed on the one or more victim addresses, processing continues with block 420.

At block 420, the one or more victim addresses may be inverted. Bit inversion address translation may be performed as (Row Address XOR 0xebf8), processing continues with block 422.

At block 422, the Victim Row Address [17:13] bits are not updated and retain the same value as Aggressor Row Address [17:13] respectively based on per address bit Control Status Register (CSR). In some examples, this may prevent changing row bits for an unused row or LRDIMM Rank select bits. Processing continues with block 424.

At block 424, the logical addresses for the one or more victim rows may be selected for the pTRR. In some examples, this may include at least temporarily storing these one or more logical addresses in a queue or FIFO. Processing continues with block 426.

At block 426, processing is complete.

According to some examples, the increment step mentioned above for block 310 in FIG. 3 or block 410 for FIG. 4 could roll over into an address bit that is not used by the DIMM including the DRAM. Likewise the decrement could underflow. Neither of these scenarios is important to cover for reliability because they are both cases where the DRAM should not have victims. However, to prevent the carry/borrow from affecting bits that are not used by the DRAM device, in some examples, a memory controller may replace the unused bits of the row address with the row address bits from an identified aggressor row. In other examples, unused row address bits could be masked out before being sent out the DRAM, using a mask that captures the power-of-2 size of the row address field.

Figure 5:
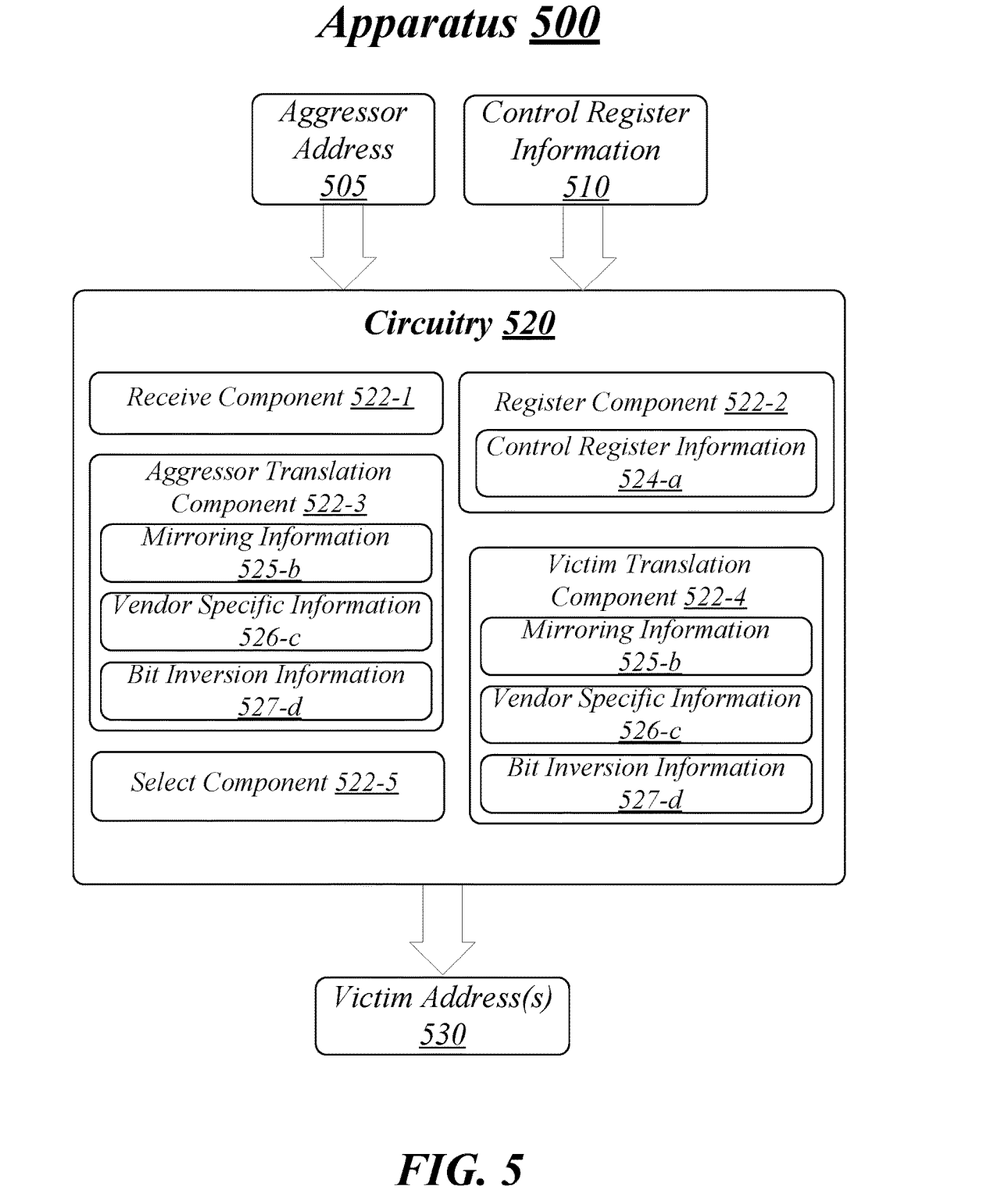
FIG. 5 illustrates an example apparatus.

FIG. 5 illustrates an example apparatus 500. Although the apparatus 500 shown in FIG. 5 has a limited number of elements in a certain topology, it may be appreciated that the apparatus 500 may include more or less elements in alternate topologies as desired for a given implementation.

The apparatus 500 may comprise a computer-implemented apparatus that may be used to determine a logical address of one or more victim rows of a DRAM based on a logical address of an aggressor row and address translation schemes associated with the DRAM as mentioned above for FIGS. 1-4. The computer-implemented apparatus 500 may be arranged to execute one or more software components 522-$a$. It is worthy to note that "a" and "b" and "c" and similar designators as used herein are intended to be variables representing any positive integer. Thus, for example, if an implementation sets a value for a=5, then a complete set of software components 522-$a$ may include components 522-1, 522-2, 522-3, 522-4 or 522-5. The examples are not limited in this context.

According to some examples, apparatus 500 may be capable of being located with a processor such as processor 110 (e.g., included in memory controller 114). For these examples, apparatus 500 may be included in or implemented by at portions of the processor's circuitry. In other examples, apparatus 500 may be implemented as part of firmware for a memory controller coupled to a processor. The examples are not limited in this context.

In some examples, if apparatus 500 is implemented as part of a processor, the processor may be generally arranged to execute one or more software components 522-$a$. The processor can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel®, Atom Celeron®, Core (2) Duo®, Core i3, Core i5, Core i7, Pentium®, Xeon®, Xeon Phi®, Itanium® and XScale® processors; and similar processors. Multi-core processors and other multi-processor architectures may also be employed to implement apparatus 500.

According to some examples, apparatus 500 may include a receive component 522-1. Receive component 522-1 may be executed by circuitry 520 to receive a first logical address for an aggressor row for DRAM. For these examples, the aggressor row may be associated with an activation that triggers a pTRR to one or more victim rows to protect against a row hammer error. The first logical address for the aggressor row may be received via aggressor address 505.

In some examples, apparatus 500 may also include a register component 522-2. Register component 522-2 may be executed by circuitry 520 to interrogate a control register for a memory controller possibly including apparatus 500. The interrogation may enable register component 522-2 to determine at least one address translation scheme to possible used for address translation based on control register information 510. Register component 522-2 may maintain control register information 524-$a$ in a data structure such as a lookup table (LUT) to at least temporarily maintain control register information 510.

According to some examples, apparatus 500 may also include an aggressor translation component 522-3. Aggressor translation component 522-3 may be executed by circuitry 520 to determine a first physical address for the aggressor row based on an address translation scheme associated with the DRAM that may have been indicated in control register information 510. For these examples, aggressor translation component 522-3 may be capable of maintaining and/or accessing mirroring information 525-$b$, vendor specific information 526-$c$ or bit inversion information 527-$d$ in one or more data structures such as a lookup table (LUT). Mirroring information 525-$b$, vendor specific information 526-$c$ or bit inversion information 527-$d$ may include address translation schemes to enable aggressor translation component 522-3 to determine the first physical address for the aggressor row.

In some examples, apparatus 500 may also include a victim translation component 522-4. Victim translation component 522-4 may be executed by circuitry 520 to increment or decrement the first physical address for the aggressor to determine one or more respective physical addresses for the one or more victim rows. Victim translation component 522-4 may then implement the address translation scheme on the one or more respective physical addresses to determine one or more respective logical addresses for the one or more victim rows. For these examples, translation component 522-4 may have access to or may maintain information included in mirroring information 525-*b*, vendor specific information 526-*c* or bit inversion information 527-*d* to implement the address translation scheme.

In some examples, apparatus 500 may also include a select component 522-5. Select component 522-5 may be executed by circuitry 520 to select the one or more respective logical addresses for the pTRR. For these examples, the one or more respective logical address selected may be included in victim address(s) 530.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

Figure 6:
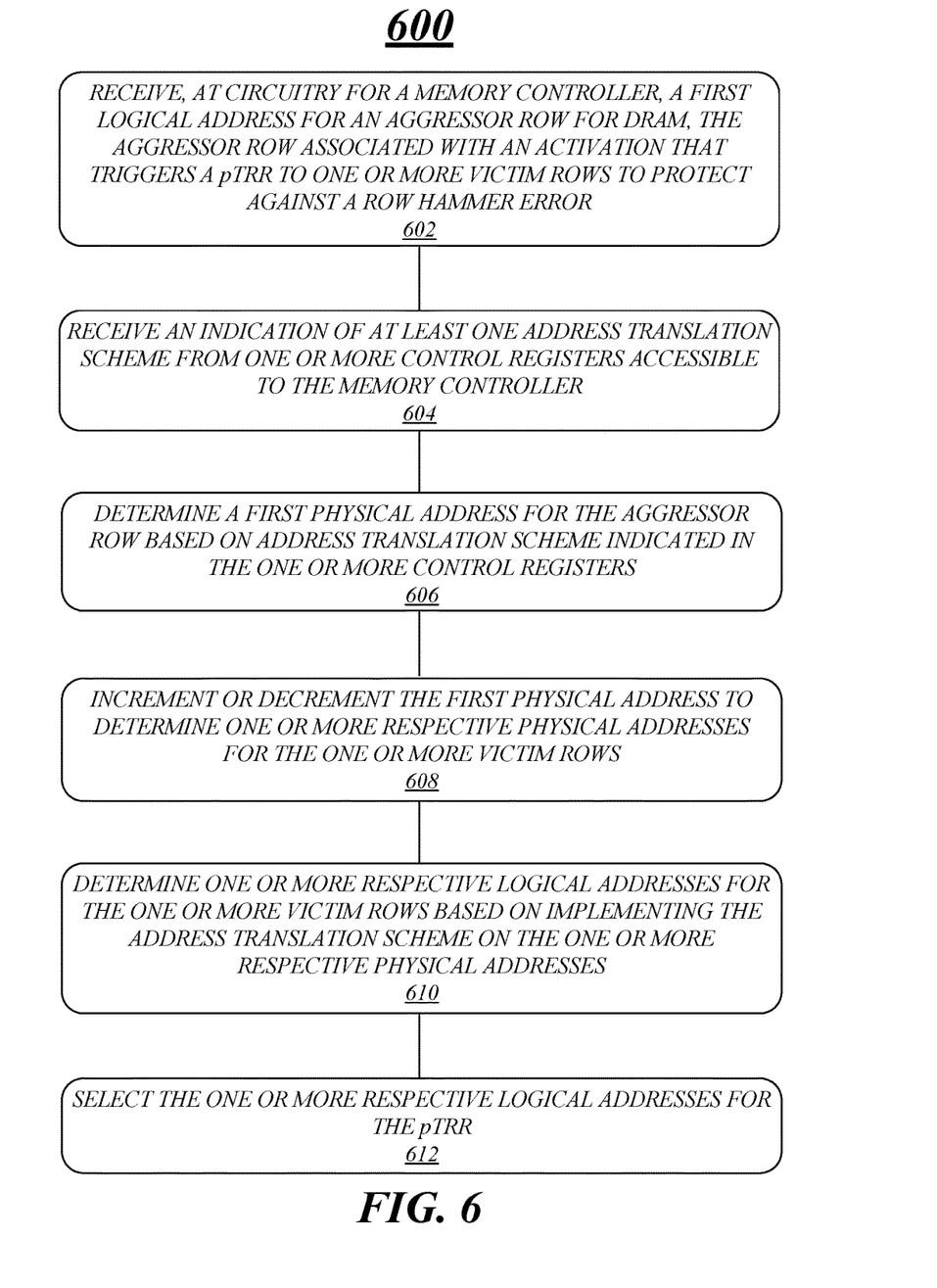
FIG. 6 illustrates an example third logic flow.

FIG. 6 illustrates a logic flow 600. Logic flow 600 may be representative of some or all of the operations executed by one or more logic, features, or devices described herein, such as apparatus 500. More particularly, logic flow 600 may be implemented by receive component 522-1, register component 522-2, aggressor translation component 522-3, victim translation component 522-4 or select component 522-5.

According to some examples, logic flow 600 at block 602 may receive, at circuitry for a memory controller, a first logical address for an aggressor row for DRAM, the aggressor row associated with an activation that triggers a pTRR to one or more victim rows to protect against a row hammer error. In some examples, receive component 522-1 may receive the first logical address.

In some examples, logic flow 600 at block 604 may receive an indication of at least one address translation scheme form one or more control registers accessible to the memory controller. For these examples, register component 522-2 may receive the indication via interrogation of a control register for the memory controller.

According to some examples, logic flow 600 at block 606 may determine a first physical address for the aggressor row based on an address translation scheme associated with the DRAM. For these examples, aggressor translation component 522-3 may determine the first physical address for the aggressor row.

In some examples, logic flow 600 at block 608 may increment or decrement the first physical address to determine one or more respective physical addresses for the one or more victim rows. For these examples, victim translation component 522-4 may increment or decrement the first physical address to determine the one or more respective physical addresses.

According to some examples, logic flow at block 610 may determine one or more respective logical addresses for the one or more victim rows based on implementing the address translation scheme on the one or more respective physical addresses. For these examples, victim translation component 522-4 may determine the one or more respective logical addresses.

In some examples, logic flow at block 612 may select the one or more respective logical addresses for the pTRR. For these examples select component 522-5 may select the one or more respective logical addresses for the pTRR.

Figure 7:
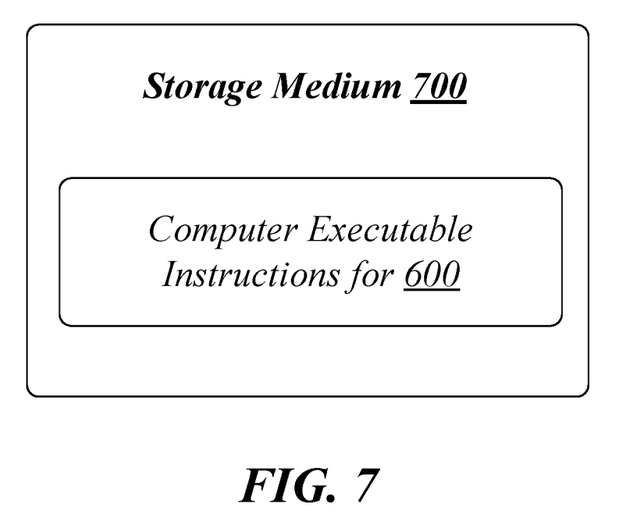
FIG. 7 illustrates an example storage medium.

FIG. 7 illustrates an embodiment of a storage medium 700. The storage medium 700 may comprise an article of manufacture. In some examples, storage medium 700 may include any non-transitory computer readable medium or machine readable medium, such as an optical, magnetic or semiconductor storage. Storage medium 700 may store various types of computer executable instructions, such as instructions to implement logic flow 600. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 8:
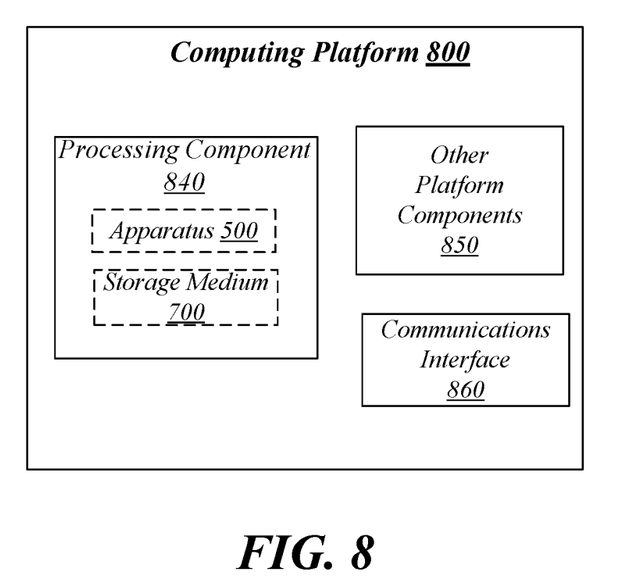
FIG. 8 illustrates an example computing platform.

FIG. 8 illustrates an example computing device 800. In some examples, as shown in FIG. 8, computing device 800 may include a processing component 840, other platform components 850 or a communications interface 860.

According to some examples, processing component 840 may execute processing operations or logic for apparatus 500 and/or storage medium 700. Processing component 840 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 850 may include common computing elements, such as one or more processors, multi-core processors, co-processors, memory units, chipsets, controllers, peripherals, interfaces, oscillators, timing devices, video cards, audio cards, multimedia input/output (I/O) components (e.g., digital displays), power supplies, and so forth. Examples of memory units associated with either other platform components 850 may include without limitation, various types of computer readable and machine readable storage media in the form of one or more higher speed memory units, such as ROM, RAM, DRAM, Double-Data-Rate DRAM (DDRAM), synchronous DRAM (SDRAM), SRAM, programmable ROM (PROM), EPROM, EEPROM, NAND flash memory, NOR flash memory, polymer memory such as ferroelectric polymer memory, ferroelectric transistor random access memory (FeTRAM or FeRAM), nanowire, ovonic memory, ferroelectric memory, 3-dimensional cross-point memory, SONOS memory, magnetic or optical cards, an array of devices such as Redundant Array of Independent Disks (RAID) drives, solid state memory devices (e.g., USB memory), SSDs and any other type of storage media suitable for storing information.

In some examples, communications interface 860 may include logic and/or features to support a communication interface. For these examples, communications interface 860 may include one or more communication interfaces that operate according to various communication protocols or standards to communicate over direct or network communication links. Direct communications may occur via use of communication protocols or standards described in one or more industry standards (including progenies and variants) to include the Peripheral Component Interconnect (PCI) Express Base Specification, revision 3.0, published in November 2010 ("PCI Express" or "PCIe"), the Universal Serial Bus Specification, revision 3.0, published in November 2008 ("USB"), the Serial ATA (SATA) Specification, revision 3.1, published in July 2001, Request for Comments (RFC) 3720, Internet Small Computer System Interface (iSCSI), published in April 2004 and/or the Serial Attached SCSI (SAS) Specification, revision 2.1, published in December 2010. Network communications may occur via use of various communication protocols and may operate in compliance with one or more promulgated standards or specifications for wired or wireless networks by the Institute of Electrical Engineers (IEEE). These standards are specifications may include, but are not limited to, IEEE 802.11-2012 Standard for Information technology—Telecommunications and information exchange between systems—Local and metropolitan area networks—Specific requirements Part 11: WLAN Media Access Controller (MAC) and Physical Layer (PHY) Specifications, published March 2012, later versions of this standard ("IEEE 802.11") for wireless mediums or IEEE 802.3-2008, Carrier sense Multiple access with Collision Detection (CSMA/CD) Access Method and Physical Layer Specifications, Published in December 2008 (hereinafter "IEEE 802.3") for wired mediums, one or more protocols that may encapsulate Fibre Channel frames over Ethernet networks referred to as fiber channel over Ethernet (FCoE), compatible with the protocols described by the American National Standard of Accredited Standards Committee INCITS T11 Technical Committee, Fibre Channel Backbone-5 (FC-BB-5) Standard, Revision 2.0, published June 2009 and/or protocols associated with RFC 3530, Network File System (NFS), version 4 Protocol, published in April 2003.

Computing device 800 may be part of a system or device that may be, for example, user equipment, a computer, a personal computer (PC), a desktop computer, a laptop computer, a notebook computer, a netbook computer, a tablet computer, an Ultrabook™, a tablet, a wearable computer, a portable gaming console, a portable media player, a smart phone, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing device 800 described herein, may be included or omitted in various embodiments of computing device 800, as suitably desired.

The components and features of computing device 800 may be implemented using any combination of discrete circuitry, application specific integrated circuits (ASICs), logic gates and/or single chip architectures. Further, the features of computing device 800 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the exemplary computing device 800 shown in the block diagram of FIG. 8 may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
logic for one or more memory devices, at least a portion of the logic in hardware, the logic to:
receive a first logical address for an aggressor row for a volatile memory included in the one or more memory devices, the aggressor row associated with an activation that triggers a target row refresh (TRR) to one or more victim rows to protect against a row hammer error;
determine a first physical address for the aggressor row based on an address translation scheme associated with the volatile memory;
determine one or more respective adjacent physical addresses for the one or more victim rows based on the first physical address and implement the address translation scheme on the one or more respective adjacent physical addresses to determine one or more respective logical addresses for the one or more victim rows; and
select the one or more respective logical addresses for the TRR.

2. The apparatus of claim 1, wherein the activation to trigger the TRR is responsive to a transaction rate based on a value of P, where P is set to reduce a likelihood of the row hammer error due to a total number of activations to the aggressor row before a scheduled row refresh to the one or more victim rows.

3. The apparatus of claim 1, the address translation scheme comprising at least one of a direct logical-to-physical, a mirroring, a vendor specific, or a bit inversion address translation scheme.

4. The apparatus of claim 3, the one or more memory devices comprising one or more dynamic random access memory (DRAM) devices, the DRAM devices included in a dual in-line memory module (DIMM).

5. The apparatus of claim 4, comprising the mirroring address translation scheme includes swapping address bits pairwise on one side of the DIMM.

6. The apparatus of claim 4, comprising the vendor specific address translation scheme includes the logic to implement a remap operation specified by a vendor of the DIMM.

7. The apparatus of claim 4, comprising the bit inversion address translation scheme includes the logic to invert row address bits for the DRAM included in the DIMM based on the DRAM configured as part of a first rank for the DIMM arranged for row address bit inversion.

8. The apparatus of claim 4, comprising the address translation scheme includes the mirroring or vendor specific address translation schemes and also includes the bit inversion address translation scheme.

9. The apparatus of claim 8, comprising the logic to:
invert the first logical address for the aggressor row based on the bit inversion address translation scheme and determine a second physical address for the aggressor row based on the mirroring or vendor specific address translation schemes to the inverted first logical address;
determine second one or more respective adjacent physical addresses for the one or more victim rows based on the first physical address and determine one or more respective second logical addresses for the one or more victim rows based on the mirroring or vendor specific address translation schemes;
invert the one or more respective second logical addresses; and
select the inverted one or more respective second logical addresses for the TRR.

10. The apparatus of claim 4, comprising the address translation scheme includes the bit inversion address translation scheme.

11. The apparatus of claim 10, comprising the logic to:
invert the first logical address for the aggressor row based on the bit inversion address translation scheme to determine a second physical address for the aggressor row;
determine second one or more respective adjacent physical addresses for the one or more victim rows based on the first physical address;
invert the one or more respective second logical addresses; and
select the inverted one or more respective second logical address for the TRR.

12. The apparatus of claim 1, the one or more memory devices comprising one or more dynamic random access memory (DRAM) devices, the volatile memory included in the one or more DRAM devices comprises double data rate (DDR) DRAM to include DDR3DRAM or DDR4 DRAM.

13. The apparatus of claim 1, the logic is part of the one or more memory devices.

14. The apparatus of claim 1, the logic is part of a memory controller.

15. The apparatus of claim 1, the logic is part of a device that includes a memory controller and the one or more memory devices.

16. The apparatus of claim 1, the one or more memory devices comprising one or more dynamic random access memory (DRAM) devices, the DRAM devices included in a dual in-line memory module (DIMM), wherein the logic is part of the DIMM.

17. A method comprising:
receiving, at circuitry for controlling one or more memory devices, a first logical address for an aggressor row for a volatile memory included in the one or more memory devices, the aggressor row associated with an activation that triggers a target row refresh (TRR) to one or more victim rows to protect against a row hammer error;
determining a first physical address for the aggressor row based on an address translation scheme associated with the volatile memory;
determining one or more respective adjacent physical addresses for the one or more victim rows based on the first physical address;
determining one or more respective logical addresses for the one or more victim rows based on implementing the address translation scheme on the one or more respective physical addresses; and
selecting the one or more respective logical addresses for the TRR.

18. The method of claim 17, wherein the activation to trigger the TRR is responsive to transaction rate based on a value of P, where P is set to reduce a likelihood of the row hammer error due to a total number of activations to the aggressor row before a scheduled row refresh to the one or more victim rows.

19. The method of claim 18, the address translation scheme comprising at least one of a direct logical-to-physical, a mirroring, a vendor specific, or a bit inversion address translation scheme.

20. The method of claim 19, the one or more memory devices comprising one or more dynamic random access memory (DRAM) devices, the DRAM devices included in a dual in-line memory module (DIMM).

21. The method of 20, comprising the mirroring address translation scheme includes swapping address bits pairwise on one side of the DIMM.

22. The method of claim 20, comprising the vendor specific address translation scheme includes a remapping operation specified by a vendor of the DIMM.

23. The method of claim 20, comprising the bit inversion address translation scheme includes inverting row address bits for the DRAM included in the DIMM based on the DRAM configured as part of a first rank for the DIMM arranged for row address bit inversion.

24. The method of claim 20, comprising the address translation scheme including the mirroring or vendor specific address translation schemes and also including the bit inversion address translation scheme.

25. The method of claim 24, comprising:
inverting the first logical address for the aggressor row based on the bit inversion address translation scheme;
determining a second physical address for the aggressor row based on the mirroring or vendor specific address translation schemes to the inverted first logical address;
determining second one or more respective adjacent physical addresses for the one or more victim rows based on the first physical address;
determining one or more respective second logical addresses for the one or more victim rows based on the mirroring or vendor specific address translation schemes;
inverting the one or more respective second logical addresses; and
selecting the inverted one or more respective second logical addresses for the TRR.

26. The method of claim 25, comprising selecting including causing one or more respective logical addresses to be stored in a first-in, first-out (FIFO) memory, the FIFO memory used to schedule a TRR command to cause the TRR to be sent to the one or more victim rows.

27. At least one non-transitory machine readable medium comprising a plurality of instructions that in response to being executed by a system for accessing one or more memory devices causes the system to:
receive a first logical address for an aggressor row for volatile memory included in the one or more memory devices, the aggressor row associated with an activation that triggers a pseudo target row refresh (TRR) to one or more victim rows to protect against a row hammer error;
determine a first physical address for the aggressor row based on an address translation scheme associated with the volatile memory;
determine one or more respective adjacent physical addresses for the one or more victim rows based on the first physical address;
determine one or more respective logical addresses for the one or more victim rows based on implementing the address translation scheme on the one or more respective physical addresses; and
select the one or more respective logical addresses for the TRR.

28. The at least one non-transitory machine readable medium of claim 27, wherein the activation to trigger the TRR is responsive to transaction rate based on a value of P, where P is set to reduce a likelihood of the row hammer error due to a total number of activations to the aggressor row before a scheduled row refresh to the one or more victim rows.

29. The at least one non-transitory machine readable medium of claim 28, the address translation scheme comprising at least one of a direct logical-to-physical, a mirroring, a vendor specific, or a bit inversion address translation scheme.

30. The at least one non-transitory machine readable medium of claim 29, one or more memory devices comprising one or more dynamic random access memory (DRAM) devices, the DRAM devices included in a dual in-line memory module (DIMM).

31. The at least one non-transitory machine readable medium of claim 30, comprising the address translation scheme including the mirroring or vendor specific address translation schemes and also including the bit inversion address translation scheme, the instructions to also cause the system to:
  invert the first logical address for the aggressor row based on the bit inversion address translation scheme;
  determine a second physical address for the aggressor row based on the mirroring or vendor specific address translation schemes to the inverted first logical address;
  determine second one or more respective adjacent physical addresses for the one or more victim rows based on the first physical address;
  determine one or more respective second logical addresses for the one or more victim rows based on the mirroring or vendor specific address translation schemes;
  invert the one or more respective second logical addresses; and
  select the inverted one or more respective second logical addresses for the TRR.

* * * * *